United States Patent
Sano et al.

(10) Patent No.: US 6,853,172 B2
(45) Date of Patent: Feb. 8, 2005

(54) SWITCHING REGULATOR

(75) Inventors: Kazuaki Sano, Chiba (JP); Takeshi Naka, Tokyo (JP)

(73) Assignees: Seiko Instruments Inc., Chiba (JP); Device Engineering Co., Ltd., Tokyo (JP)

( * ) Notice: Subject to any disclaimer, the term of this patent is extended or adjusted under 35 U.S.C. 154(b) by 0 days.

(21) Appl. No.: 10/696,182

(22) Filed: Oct. 28, 2003

(65) Prior Publication Data

US 2004/0113598 A1 Jun. 17, 2004

(30) Foreign Application Priority Data

Oct. 30, 2002 (JP) ........................................ 2002-315733

(51) Int. Cl.$^7$ ................................................ G05F 1/40
(52) U.S. Cl. ........................ 323/284; 323/282; 323/288
(58) Field of Search ............................... 323/265, 282, 323/284, 288

(56) References Cited

U.S. PATENT DOCUMENTS 6,198,264 B1 * 3/2001 Nagaya et al. .............. 323/284
6,229,293 B1 * 5/2001 Farrenkopf ................. 323/288

* cited by examiner

Primary Examiner—Gary L. Laxton
(74) Attorney, Agent, or Firm—Adams & Wilks

(57) ABSTRACT

To provide a switching regulator with a small packaging area. A switching regulator according to the present invention includes: a first terminal for inputting an output voltage of the switching regulator; a reference voltage source for generating a reference voltage; a voltage divider circuit for dividing the output voltage of the switching regulator; an error amplifier for inputting the reference voltage and an output signal of the voltage divider circuit; a first circuit block having a resistance, for outputting a signal that varies depending on a resistance value of the resistance; a second circuit block having a square wave oscillator, for outputting a signal based on an output signal of the square wave oscillator and an output signal of the first circuit block; a third circuit block having a logic circuit for receiving the output signal of the square wave oscillator and the output signal of the second circuit block to output a signal, and a circuit for outputting an output signal, which is controlled based on an output of the logic circuit; and a comparator for receiving an output of the error amplifier and the output signal of the third circuit block to output a signal.

1 Claim, 3 Drawing Sheets

SWITCHING REGULATOR

BACKGROUND OF THE INVENTION

1. Field of the Invention

The present invention relates to a switching regulator.

2. Description of the Related Art

As a switching regulator, there have been known methods of adjusting a maximum duty ratio as shown in a circuit diagram of FIG. 3. In FIG. 3, a switching regulator circuit includes: an error amplifier 10 for comparing a voltage obtained by dividing an output voltage Vout of the switching regulator by resistances 2 and 3 and a voltage of a reference voltage source 4; and a comparator 7 for making a comparison among an output voltage Vr of the error amplifier 10, an output voltage of an oscillator 1 for generating a triangular wave, and a voltage Vp divided by resistances 5 and 6.

An output voltage EXT of the comparator 7 is used to drive a switching transistor of the switching regulator. As shown in FIGS. 4A and 4B, the comparator 7 compares an output of the oscillator 1 and a value of the lower one of the voltages Vr and Vp.

In other words, even if the voltage Vout drops and the voltage Vr reaches a high voltage level, as shown in FIG. 4B, a duty ratio of the voltage EXT by no means exceeds a maximum duty ratio defined on the basis of the voltage Vp.

Further, in some conventional methods, one more oscillator circuit that oscillates at the same frequency is adopted to adjust the maximum duty ratio (see, for example, JP 2000-217340 A).

In addition, in some conventional methods, a circuit for outputting a voltage depending on a power source voltage is used to adjust the maximum duty ratio (see, for example, JP 11-235025 A).

In the conventional methods of adjusting the maximum duty ratio, however, the voltage Vp needs to be adjusted using the two resistances 5 and 6, which causes a problem in that the two resistances occupy a larger packaging area.

SUMMARY OF THE INVENTION

Accordingly, with a view to solving the above-mentioned problems inherent to the prior art, it is an object of the present invention to adjust a maximum duty ratio of a switching regulator using one resistance.

In order to attain the above-mentioned object, a method of adjusting the maximum duty ratio of the switching regulator according to the present invention includes adjusting a resistance value of only one resistance to enable a circuit with an adjustable maximum duty ratio.

A switching regulator according to the present invention includes: a first terminal for inputting an output voltage of the switching regulator; a reference voltage source for generating a reference voltage; a voltage divider circuit for dividing the output voltage of the switching regulator; and an error amplifier for inputting the reference voltage and an output signal of the voltage divider circuit. Further, the switching regulator includes: a first circuit block having a resistance, for outputting a signal that varies depending on a resistance value of the resistance; and a second circuit block having a square wave oscillator, for outputting a signal based on an output signal of the square wave oscillator and an output signal of the first circuit block, a third circuit block having a logic circuit for receiving the output signal of the square wave oscillator and the output signal of the second circuit block to output a signal, and a circuit for outputting an output signal, which is controlled based on an output of the logic circuit; and a comparator for receiving an output of the error amplifier and the output signal of the third circuit block to output a signal.

DETAILED DESCRIPTION OF THE PREFERRED EMBODIMENT

Figure 1:
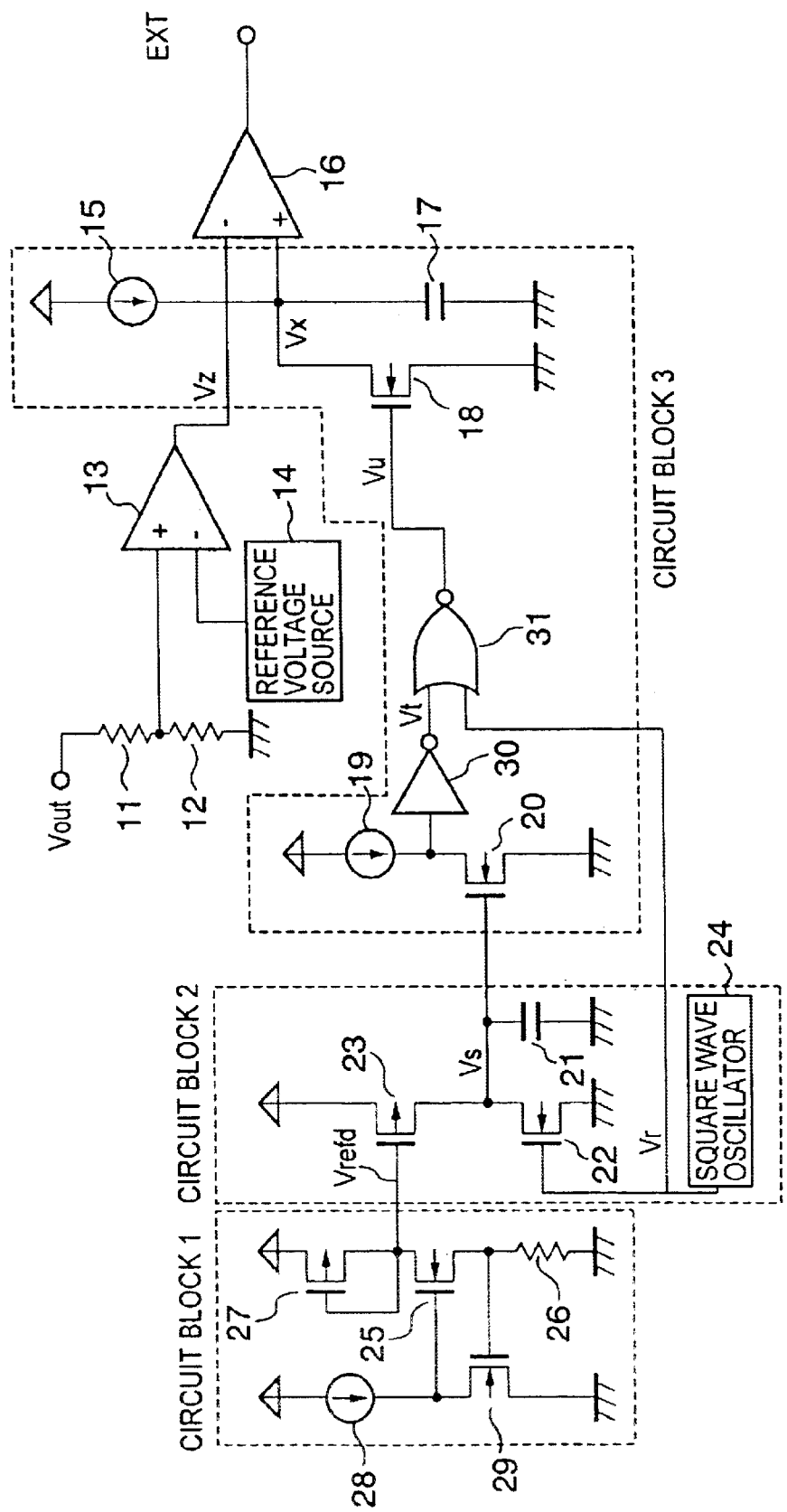
FIG. 1 is a circuit diagram of a switching regulator in accordance with an embodiment of the present invention.

Hereinafter, an embodiment of the present invention will be described with reference to the accompanying drawings. FIG. 1 is a circuit diagram of a switching regulator in accordance with the embodiment of the present invention.

A circuit block A including a constant current source 28, transistors 25, 27, and 29, and a resistance 26 serves to generate a gate voltage Vrefd of a transistor 23. When a resistance value of the resistance 26 increases, the gate voltage Vrefd increases to allow a larger amount of current to flow through the transistor 23. In contrast, when the resistance value of the resistance 26 decreases, the gate voltage Vrefd decreases to lessen the amount of current flowing through the transistor 23.

A circuit block B including an oscillator 24 that outputs a square wave, the transistor 23 having a current value that varies depending on the resistance value of the resistance 26, and a capacitor 21 serves to generate a gate voltage Vs of a transistor 20.

Figure 2:
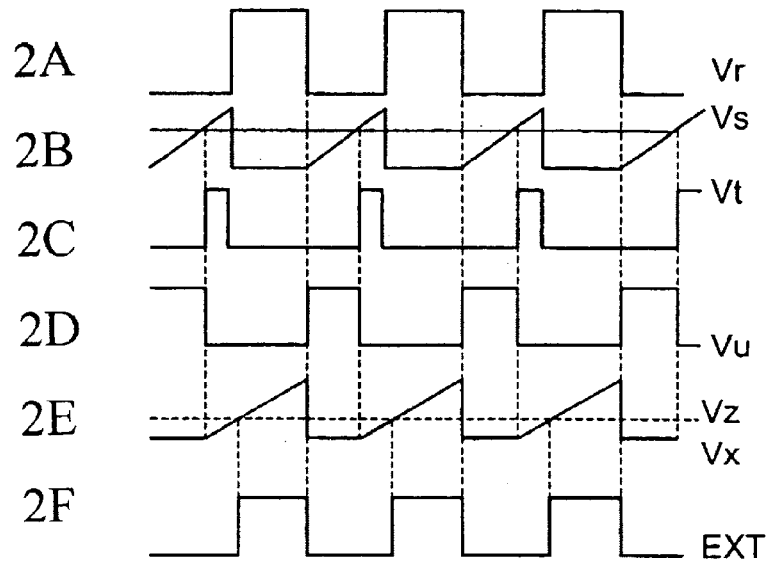
FIGS. 2A to 2F are waveform charts related to the circuit diagram of FIG. 1.
Figure 3:
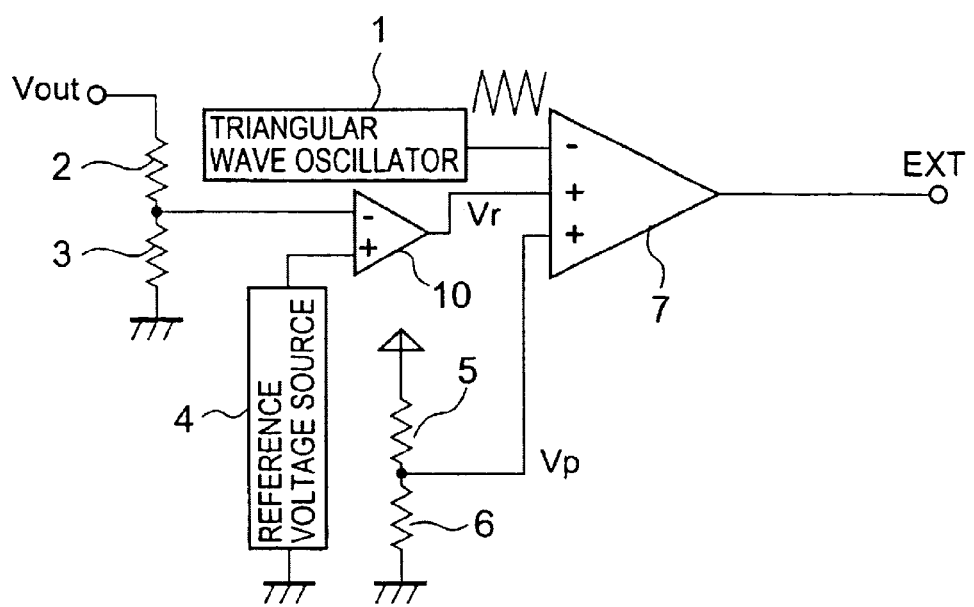
FIG. 3 is a circuit diagram of a conventional switching regulator.
Figure 4A:
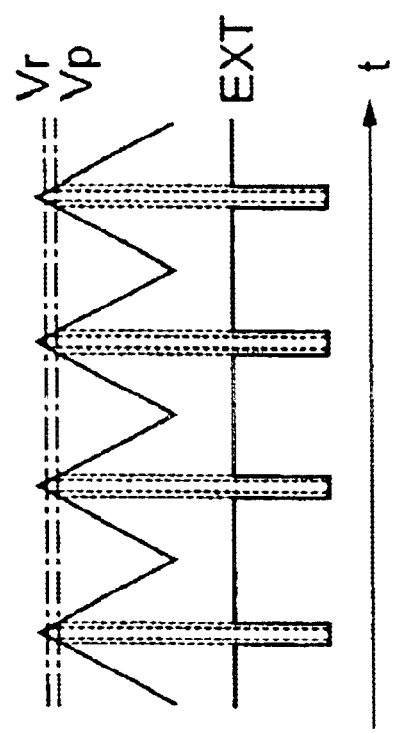
FIGS. 4A and 4B are waveform charts related to the circuit diagram of FIG. 3.
Figure 4B:
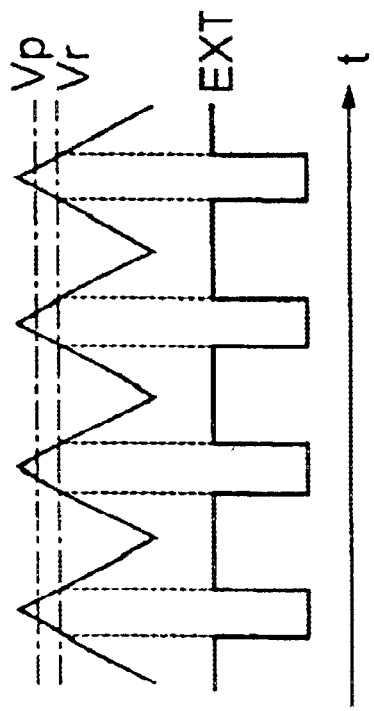

As shown in FIG. 2B, during a time period in which an output voltage Vr of the oscillator 24 is low (L), the capacitor 21 is charged with the current flowing through the transistor 23. Subsequently, as shown in FIG. 2C, when a potential of the voltage Vs exceeds a threshold voltage of the transistor 20, an output voltage Vt of an inverter 30 is inverted. A time period from the start of the charging of the capacitor 21 to the inversion of the voltage Vt is defined depending on the current flowing through the transistor 23, a capacitance of the capacitor 21, and a level of the sub-threshold voltage of the transistor 20.

The output Vr of the oscillator 24 and the output voltage Vt of the inverter 30 are inputted to a NOR circuit 31. As shown in FIG. 2D, an output voltage Vu of the NOR circuit 31 becomes high (H) during a time period from the start of the charging of the capacitor 21 to the inversion of the voltage Vt.

While the voltage Vu is low (L), a capacitor 17 is charged by a constant current source 15. As shown in FIG. 2E, during a time period in which a voltage Vx is completely at a low (L) level, the voltage Vu is high (H).

An output voltage of an error amplifier 13 for comparing a voltage obtained by dividing the output voltage Vout of the switching regulator by resistances 11 and 12 and an output voltage of a reference voltage source 14 is compared with the voltage Vx by a comparator 16. When the voltage Vout drops, an output voltage Vz of the error amplifier 13 drops, so that a duty ratio of an output voltage EXT of the comparator 16 increases. However, at least during a time period in which the voltage Vx is completely at the low (L) level, the voltage EXT is low.

Based on the foregoing, by adjusting the resistance value of the resistance 26 alone, the maximum duty ratio of the voltage EXT can be adjusted.

As described above, according to the method of adjusting the maximum duty ratio of the switching regulator of the present invention, by adjusting the resistance value of only one resistance, the maximum duty ratio can be adjusted. Consequently, the requisite number of resistances in the circuit can be reduced, resulting in reduction in packaging area of the circuit of the switching regulator.

What is claimed is:

1. A switching regulator comprising:
   a first terminal for inputting an output voltage of the switching regulator;
   a reference voltage source for generating a reference voltage;
   a voltage divider circuit for dividing the output voltage of the switching regulator;
   an error amplifier for inputting the reference voltage and an output signal of the voltage divider circuit;
   a first circuit block having one resistance, for outputting a signal that varies depending on a resistance value of the resistance;
   a second circuit block having a square wave oscillator, for outputting a signal based on an output signal of the square wave oscillator and an output signal of the first circuit block;
   a third circuit block having a logic circuit for receiving the output signal of the square wave oscillator and the output signal of the second circuit block to output a signal, and a circuit for outputting an output signal which is controlled based on an output of the logic circuit; and
   a comparator for receiving an output of the error amplifier and the output signal of the third circuit block to output a signal.

* * * * *